United States Patent [19]

Severin et al.

[11] Patent Number: 5,980,679
[45] Date of Patent: Nov. 9, 1999

[54] METHOD OF SELECTIVELY METALLIZING A SUBSTRATE USING A HOT FOIL EMBOSSING TECHNIQUE

[75] Inventors: Jan W. Severin, St. Cyr au Mt.d'OR, France; Franciscus A. Meeuwsen, Eindhoven, Netherlands

[73] Assignee: U.S. Philips Corporation, New York, N.Y.

[21] Appl. No.: 09/027,831

[22] Filed: Feb. 23, 1998

[30] Foreign Application Priority Data

Feb. 21, 1997 [EP] European Pat. Off. .............. 97200504

[51] Int. Cl.⁶ .................................................. B44C 1/165
[52] U.S. Cl. .......................... 156/233; 156/234; 156/239; 156/240
[58] Field of Search .................... 156/230, 233, 156/234, 235, 237, 238, 239, 240, 241, 247, 261, 277, 289

[56] References Cited

U.S. PATENT DOCUMENTS

| | | |
|---|---|---|
| 1,124,869 | 1/1915 | Davis et al. ............................ 156/233 |
| 2,306,256 | 12/1942 | Wickwire, Jr. et al. ..................... 41/37 |
| 2,776,235 | 1/1957 | Peck ........................................... 154/95 |
| 3,547,724 | 12/1970 | Zagusta ..................................... 156/233 |
| 4,393,576 | 7/1983 | Dahlberg ................................... 29/572 |
| 4,495,232 | 1/1985 | Bauser et al. .............................. 428/41 |
| 4,517,739 | 5/1985 | Lenaerts et al. ........................... 29/846 |
| 4,889,573 | 12/1989 | Stein et al. ................................. 156/89 |

Primary Examiner—Curtis Mayes
Assistant Examiner—J. A. Lorengo
Attorney, Agent, or Firm—Daniel E. Tierney

[57] ABSTRACT

A method of selectively metallizing a thermoplastic substrate using a hot foil embossing technique, a patterned metal layer being transferred to the substrate from a metal foil by a cutting and pressing procedure including steps (a) and (b). In step (a) the patterned metal layer is first cut from the foil using a punch-press at a selected pressure $p_a$. In step (b) the cut patterned metal layer is then attached to the substrate using a press at a pressure $p_b$ which is $\leq 10$ N/mm² and also $<p_a$, and a temperature $T_b \geq 100°$ C. This avoids concurrent application of high pressure and high temperature, which could cause formation of upset edges at the surface of the substrate.

5 Claims, 4 Drawing Sheets

METHOD OF SELECTIVELY METALLIZING A SUBSTRATE USING A HOT FOIL EMBOSSING TECHNIQUE

BACKGROUND OF THE INVENTION

The invention relates to a method of selectively metallizing a thermoplastic substrate using a hot foil embossing technique, whereby a patterned metal layer is transferred to the substrate from a metal foil with the aid of a cutting and pressing procedure.

Such a method can, for example, be employed in the manufacture of printed circuit boards or molded interconnection devices, in which case the patterned metal layer represents the component lands and interconnecting tracks of (part of) an electrical circuit. In particular, the method can, for example, be employed in the production of Smart-Cards.

The term "thermoplastic" is intended to refer to any polymeric material which softens under the influence of relatively gentle heating (to a temperature of the order of about 300° C., at most), and subsequently solidifies upon cooling; this mechanism can therefore be exploited in adhering the metal layer to the substrate, whereby the metal layer sinks into and sticks to the temporarily softened substrate at an elevated temperature.

A method as set forth in the opening paragraph is known from U.S. Pat. No. 2,776,235. In the procedure therein described, a heated punch-press (transfer tool) with a given surfacial form is used in a single-step procedure to punch a patterned layer of metal from a uniformly-metallized carrier foil and to simultaneously adhere that layer to the substrate.

A process of this type is described in more detail in the commercial brochure "IVONDING®: A process for manufacturing MID" supplied by Bolta-Werke GmbH, Leinburg, Germany, which makes reference to the IVONDING® embossing foil described in U.S. Pat. No. 4,495,232. In particular, the table on page 3 of this brochure specifies an embossing pressure of 70–90 N/mm² and an embossing temperature of 130–280° C. for use in the known method.

A disadvantage of the known method is that it often results in so-called "upset edges" on the substrate, whereby small upright walls appear on the substrate surface near to the edges of the patterned metal layer. These upset edges are typically of the order of about 50–100 $\mu$m high, and can be a severe hindrance to proper electrical contact between the patterned metal layer and an overlying metal contact, since they force an air space between the former and the latter. This is particularly the case when an integrated circuit (IC) is mounted on the substrate using the so-called "flip chip" technique, whereby tiny solder bumps on the surface of the IC are intended to press against the patterned metal layer at certain locations; because such solder bumps are generally of the order of about 50 $\mu$m high, the presence of upset edges on the substrate can completely prevent the bumps from contacting the patterned metal layer. The result is either no electrical contact at all, or a very poor electrical contact.

SUMMARY OF THE INVENTION

It is an object of the invention to alleviate this problem. In particular, it is an object of the invention to provide a hot foil embossing method which results in a drastically reduced incidence, or even the complete absence, of upset edges as hereabove described.

These and other objects are achieved in a method as stated in the opening paragraph, characterized in that:

(a) the patterned metal layer is first cut from the foil using a punch-press;
(b) the cut patterned metal layer is subsequently attached to the substrate using a press at a pressure $p_b \leq 10$ N/mm² and a temperature $T_b \geq 100°$ C.

In experiments leading to the invention, the inventors observed that, in the known method, the incidence of upset edges decreased if either the pressure or temperature of the punching process was decreased. However, such a decrease was usually accompanied by a poor-quality cut of the metal pattern and/or by deteriorated adhesion of the metal pattern to the substrate. It appeared that high pressure was essential to producing a good-quality metal-pattern cut, whereas high temperature was essential to producing good adhesion to the substrate.

The inventors eventually realized that the upset edges in the known method might be caused by the simultaneous occurrence of high pressure and high temperature—the high temperature causing thermal softening of the substrate material, which was then easily deformed under the influence of simultaneous high pressure. In an attempt to address this shortcoming, a two-step hot foil embossing procedure was proposed, whereby a cutting step (a) was first performed at relatively low temperature (e.g. room temperature), and a subsequent elevated-temperature adhesion step (b) was performed at relatively low pressure (i.e. $p_b \leq 10$ N/mm², which is drastically lower than the value of 70–90 N/mm² employed in the prior art and referred to above). In the first tests of this method according to the invention, the inventors were able to drastically reduce the incidence and size of upset edges.

In a particular embodiment of the method according to the invention, steps (a) and (b) are performed at different temperatures. For example, a punch-press at room temperature may be used to perform step (a), and a hot punch-press (at a temperature $T_b \geq 100°$ C.) may be used to enact step (b). Such an embodiment can be referred to as a two-phase embodiment, since different presses can be used in steps (a) and (b), any span of time may lapse between performing steps (a) and (b), and the cut-out patterned metal layer may be stowed between steps (a) and (b).

An alternative embodiment of the method according to the invention is characterized in that steps (a) and (b) are performed at substantially the same temperature ($T_b \geq 100°$ C.). In general, the force applied by the press during step (a) may have to be adjusted for the purpose of step (b), so as to satisfy the condition $p_b \leq 10$ N/mm². Such an embodiment can be referred to as a single-phase embodiment: since contact between the patterned metal layer and the overlying press need not be interrupted between steps (a) and (b), the whole hot foil embossing operation can be performed in a single run. The inventors have demonstrated that such a single-phase embodiment can typically be enacted in about 1–2 seconds.

In a particular embodiment of the method according to the invention, the metal foil is attached to a non-metallic carrier foil. Since, in many applications, the metal foil will be quite thin (of the order of a few microns), it will consequently be frail and brittle. In such cases, the presence of a reinforcing carrier foil will help prevent damage to the metal foil. The presence of a carrier foil is particularly useful in the case of a two-phase embodiment of the inventive method, since the patterned metal layer resulting from step (a) may be left lying around (stowed) for some time before step (b) is enacted.

In a particular embodiment of the method described in the previous paragraph, the carrier foil's elongation at break is substantially greater than that of the metal foil. In that case, if the employed punch-press force is sufficiently small, then the punching step (a) will only sever the patterned metal layer from the surrounding metal foil, leaving the carrier foil intact.

The non-metallic carrier foil referred to in the previous paragraphs should be sufficiently heat resistant to prevent its being damaged during the adhering step (b). In addition, the carrier foil should be sufficiently heat-conductive to allow satisfactory warming of the patterned metal layer during the adhering step (b). In this light, suitable carrier foils may, for example, be comprised of PTFE (poly tetrafluoroethene) or TEDLAR (poly vinylfluoride). The metal foil may be attached to the carrier foil using a thermally softenable substance—e.g. paraffin wax (melting point≈82° C.)—so as to facilitate separation of the metal foil from the carrier foil after or during step (b).

In an advantageous embodiment of the inventive method, the surface of the metal foil to be attached to the substrate is provided with a film of thermally-activating adhesive. In this case, the adhesive film is activated at the temperature $T_b$, and hardens upon subsequent cooling to ambient temperature. Examples of adhesives of this type include thermally curable resins, such as epoxy resins. As an alternative to such an embodiment, (parts of) the substrate may be provided with such an adhesive film; alternatively, one may decide to rely solely on the adhesive effect resulting from pushing the metal layer into the softened thermoplastic substrate, without the use of an additional adhesive film (particularly for epoxy resin substrates, for example).

Suitable metals for use in the inventive method include, for example, Cu, Al, Ni, Sn, Pb, Au, and their alloys. These metals are relatively good electrical and thermal conductors, and can be easily soldered. For most applications, the metal foil will have a thickness of the order of about 10–100 $\mu$m.

The punch-press force necessary to satisfactorily enact step (a) will depend on the thickness $t_m$ of the metal foil, the material of the metal foil (more specifically, its shear modulus), the sharpness (definition) of the edges of the punch-press and the width of the cut in the metal foil, and will be proportional to the (cumulative) length $L_p$ of the perimeter of the patterned metal layer. For example, in the case of a copper foil for which $t_m$ =70 $\mu$m, the inventors were able to cut well-defined patterns using a perimetric force of 13 N/mm (being the total punch-press force divided by $L_p$); however, for $t_m$=20 $\mu$m, a perimetric force of only 4 N/mm was required.

A specific embodiment of the method according to the invention is characterized in that 125° C.$\leq T_b \leq$200° C. Such values of $T_b$ will not cause significant softening of most metal foils for use in the inventive method, and will not cause significant damage to common synthetic substrate materials for use in the inventive method—such as PC (polycarbonate) or PC/ABS (PC/acrylonitrile butadiene styrene). For these specific materials, $T_b$ preferably has values of about 175° C. and 145° C., respectively.

BRIEF DESCRIPTION OF THE DRAWINGS

The invention and its attendant advantages will be further elucidated with the aid of exemplary embodiments and the accompanying schematic drawings, whereby.

Corresponding features in the various Figures are denoted by the same reference symbols.

DETAILED DESCRIPTION

Embodiment 1

FIGS. 1–4 illustrate various aspects of the enaction of a particular embodiment of the method according to the invention. The illustrated embodiment is a single-phase embodiment as defined hereabove.

Figure 1:
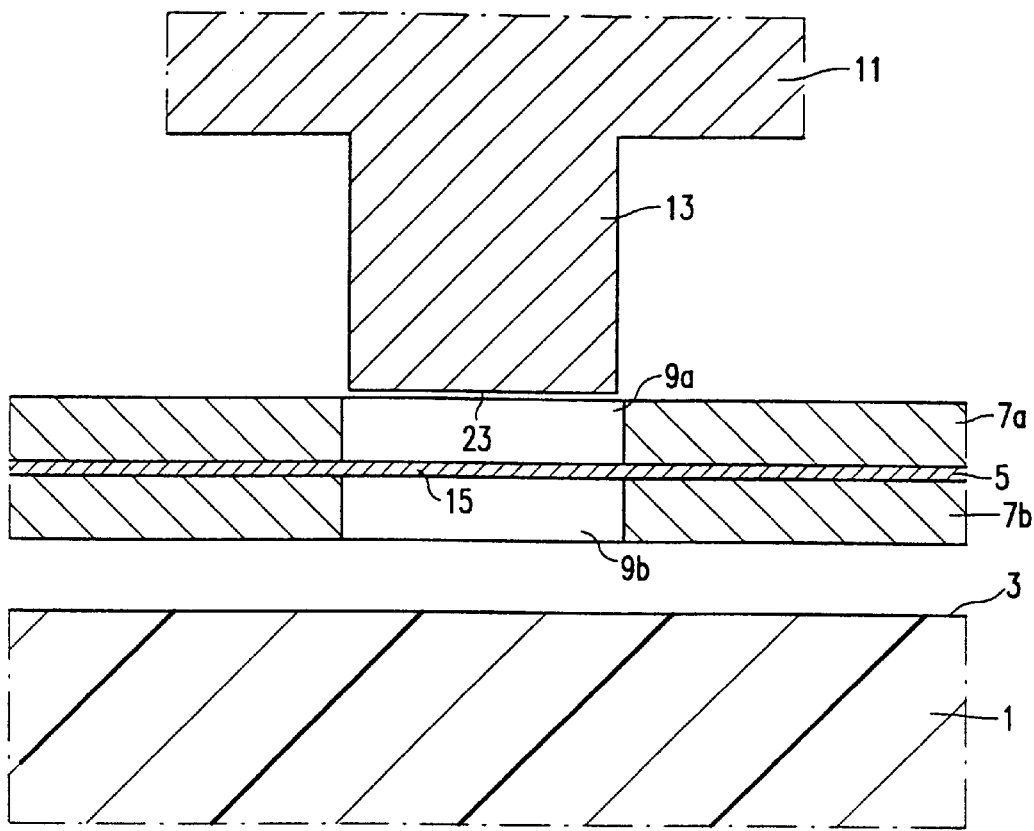
FIG. 1 renders a cross-sectional view of a set-up with which the method according to the invention can be enacted.

FIG. 1 renders a cross-sectional view of a set-up with which the method according to the invention can be enacted. A thermoplastic substrate 1 presents a smooth surface 3 which is to be provided with a patterned metal layer. This layer is to be punched out of a metal foil 5. In this particular case, the substrate 1 is comprised of polycarbonate; the foil 5 is comprised of pure Cu and has a thickness of 70 $\mu$m. The side of the foil 5 facing the substrate 1 is coated with a thin film of thermally activating adhesive (not depicted), e.g. a 2–5 $\mu$m film of dry epoxy resin.

The foil 5 is clamped (held) between two plates 7a,7b which extend substantially parallel to the surface 3. These plates 7a,7b respectively contain matching apertures 9a,9b, which are mutually separated by a portion 15 of the foil 5. A punch-press 11 is located above the aperture 9a, at the side of the plate 7a remote from the surface 3. This press 11 has a "snout" 13 which can slide intimately but freely through the aperture 9a (and also aperture 9b), since the apertures 9a,9b have the same cross-sectional form as the snout 13 and are only marginally larger. The snout 13 has a smooth lower face 23 with a given (patterned) form, e.g. a square with a side-length of 25 mm.

The press 11, or at least the snout 13, is maintained at an elevated temperature $T_b$ (e.g. approximately 150° C.). This can, for example, be achieved by incorporating an electrical heating element (not depicted) in the body of the snout 13.

Figure 2:
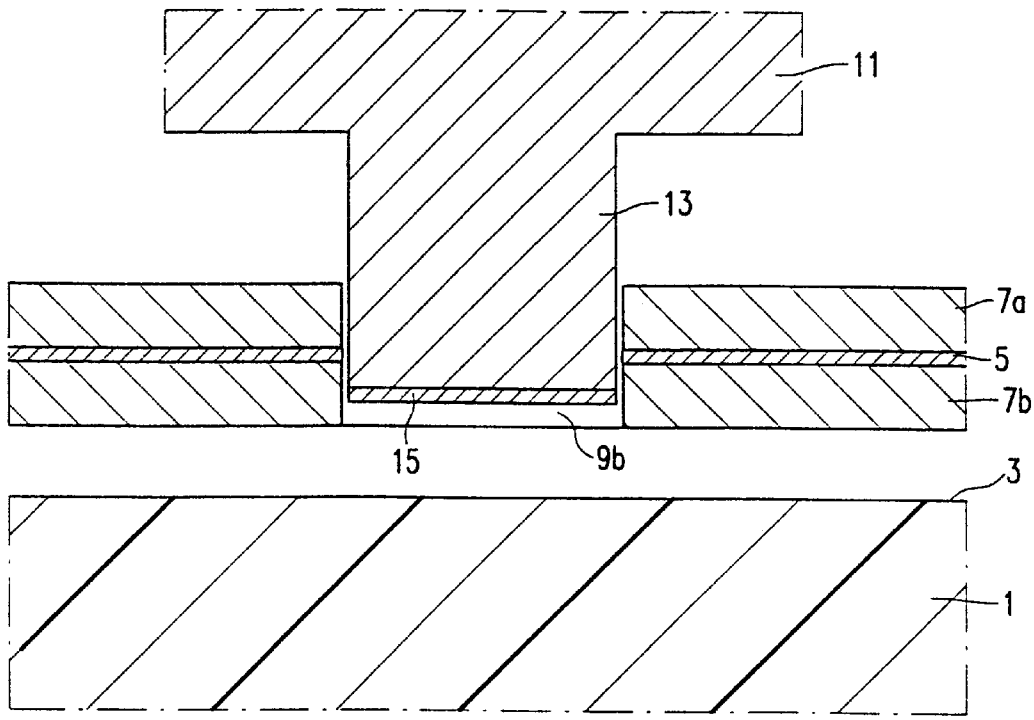
FIG. 2 shows the subject of FIG. 1, during enaction of step (a) of the method according to the invention.

FIG. 2 shows the subject of FIG. 1 just after the enaction of step (a) of the inventive method. As here depicted, the snout 13 has been inserted into the aperture 9a and on into the aperture 9b. In so doing, the snout 13 has been pushed against the portion 15 of the foil 5; as a result of the consequent shear forces in the foil 5, the portion 15 has severed from the rest of the foil 5. In this manner, a patterned metal layer 15, with the same form and size as the surface 23, has been punched out of the foil 5. It should be noted that, in the inserted state, the mechanical play (split-width) between the outer surface of the snout 13 and the inner surfaces of the surrounding apertures 9a,9b should generally be of the order of about 10–50 μm when the snout 13 is in its heated state.

The force applied by the punch-press 11 during step (a) is of the order of about 20 N per mm of $L_p$; thus, assuming the surface 23 to have a square perimeter with a side-length of 25 mm (for example), then $L_p=4\times25$ mm=100 mm, and the force applied by the press 11 amounts to approximately 2 kN.

Figure 3:
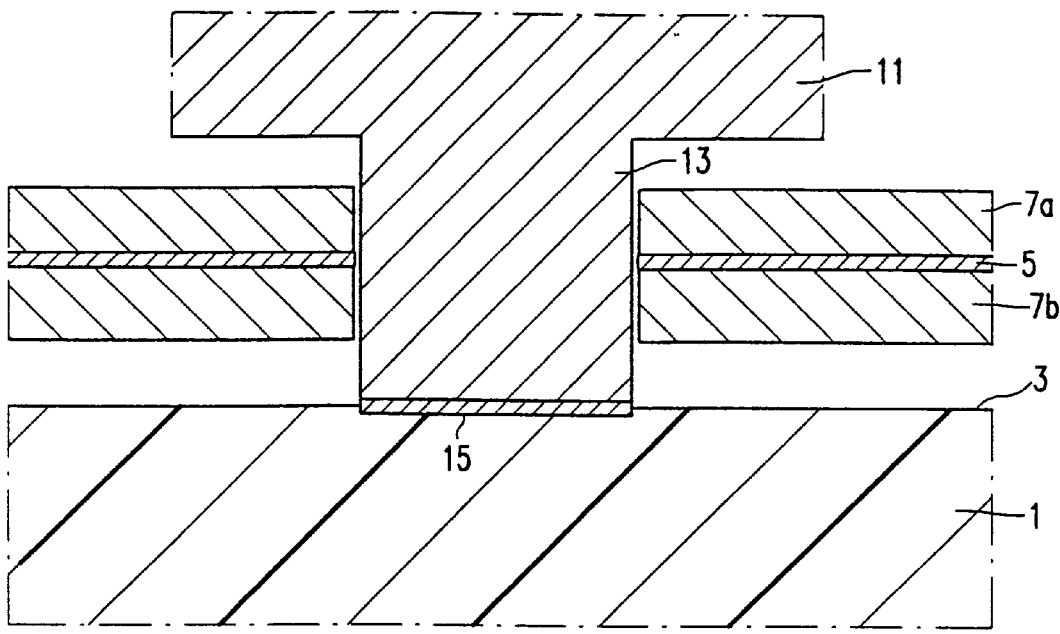
FIG. 3 depicts the subject of FIG. 2, during enaction of step (b) of the method according to the invention.

FIG. 3 depicts the subject of FIG. 2 during enaction of step (b) of the inventive method. The patterned metal layer 15 is now being pressed by the snout 13 against the surface 3 of the substrate 1. Since the snout 13 is at an elevated temperature $T_b$, this softens the thermally-activating adhesive layer on the metal layer 15, and also locally softens the surface 3 of the substrate 1. The relatively mild pressure $p_b$ applied by the press 11 during this step ensures that the patterned metal layer 15 is pushed gently into the softened surface 3, without causing significant deformation (particularly upset edges) on the surface 3.

The pressure $p_b$ applied by the press 11 during step (b) is at most 10 N/mm². Since, in this case, the patterned metal layer 15 has an area of $25\times25$ mm²=625 mm², the pressure $p_b$ corresponds to a punch-press force of at most 6.25 kN.

Figure 4:
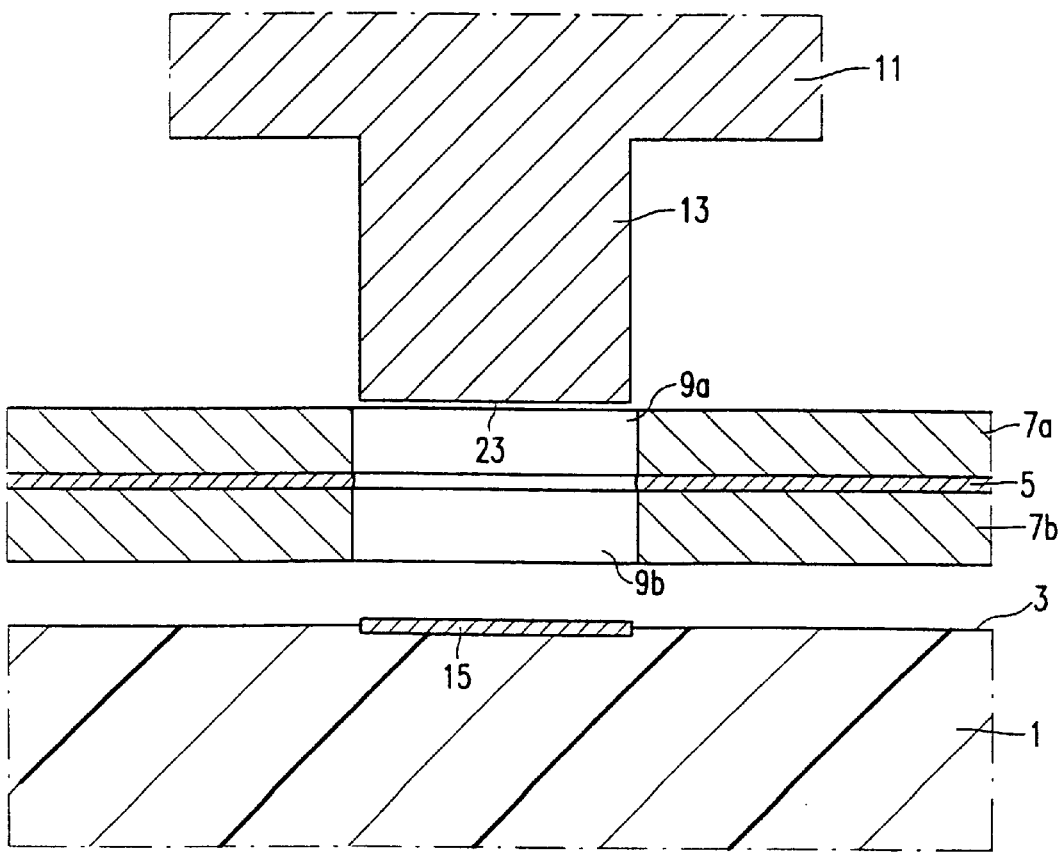
FIG. 4 shows the subject of FIG. 3 after enaction of the method according to the invention.

FIG. 4 shows the subject of FIG. 3 after enaction of the inventive method. The patterned metal layer 15 has been embossed into the surface 3 (generally protruding slightly above the level of the surrounding surface 3), and is adhered thereto.

If the foil 5 is embodied as a ribbon, then, after enaction of the inventive method, the clamping action of the plates 7a,7b can be relaxed, the ribbon 5 can be displaced and then re-clamped between the plates 7a,7b (so that there is once again an intact sheet of foil 15 between the apertures 9a,9b), a new substrate (or different region of the same substrate) can be placed beneath the aperture 9a, and the inventive method can be repeated.

COMPARATIVE EXAMPLE

Figure 5:
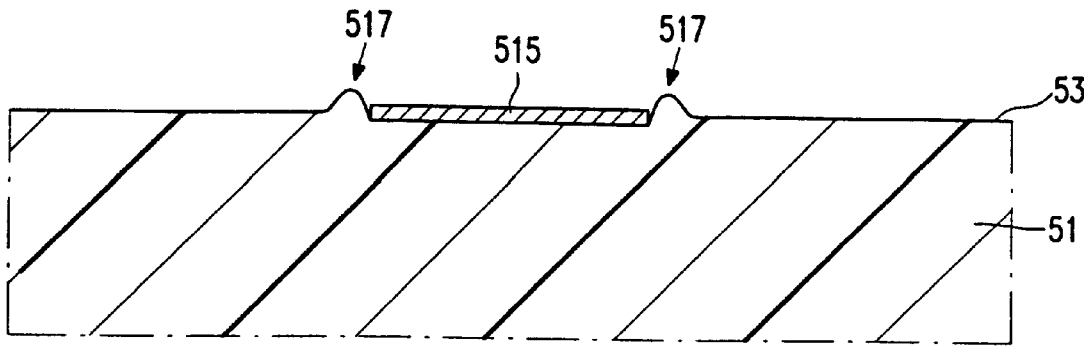
FIG. 5 is a comparative illustration of a substrate which has been provided with a patterned metal layer using a hot foil embossing technique known from the prior art.
Figure 6:
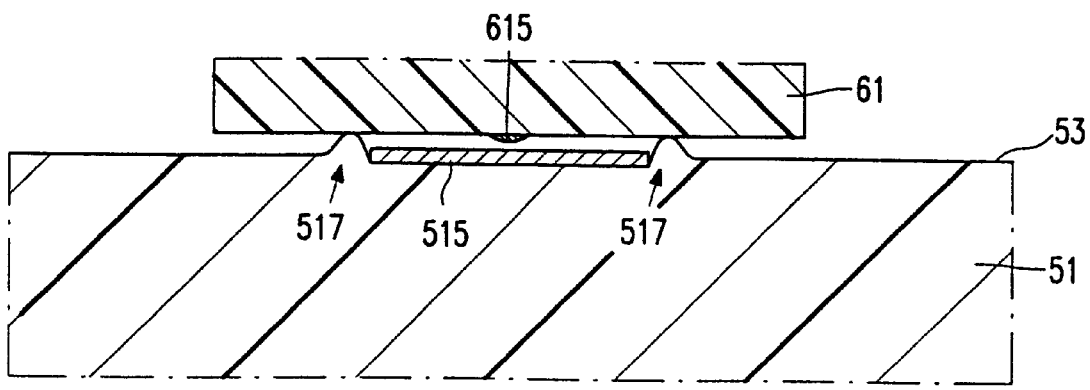
FIG. 6 shows the subject of FIG. 5, upon which it has been attempted to mount an integrated circuit.

FIGS. 5 and 6 render cross-sectional views of a substrate which has been provided with a patterned metal layer using a hot foil embossing technique known from the prior art.

FIG. 5 shows a thermoplastic substrate 51 which presents a smooth major surface 53. A patterned metal layer 515 has been embedded into the surface 53 using the hot foil embossing technique described hereabove in the Bolta GmbH brochure. As a result of the high pressure associated with that technique, molten substrate material has welled up to form upset edges 517 along the edges of the layer 515. The height of such upset edges 517 is typically of the order of about 50–100 μm above the level of the surface 53.

In FIG. 6, an integrated circuit substrate 61 has been positioned on top of the subject of FIG. 5. The substrate 61 is provided with a metallic bump (flip chip bump) 615 on the surface facing the metal layer 515. However, because the metallic bump 615 is typically about 50 μm high, the presence of the upset edges 517 hinders contact between the bump 615 and the layer 515.

Embodiment 2

Figure 7:
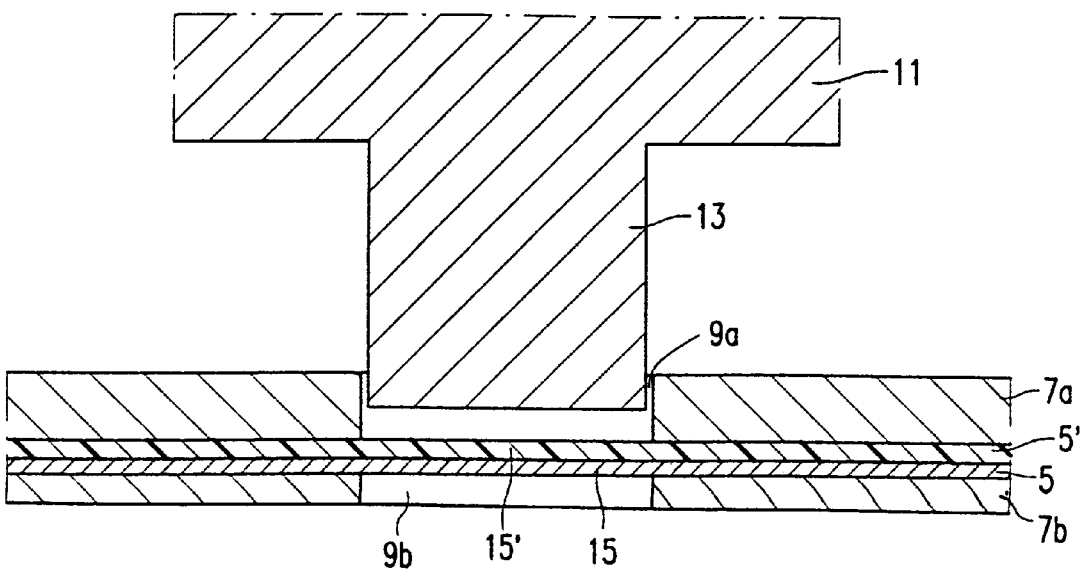
FIG. 7 renders a cross-sectional view of an alternative set-up with which the method according to the invention can be enacted.
Figure 8:
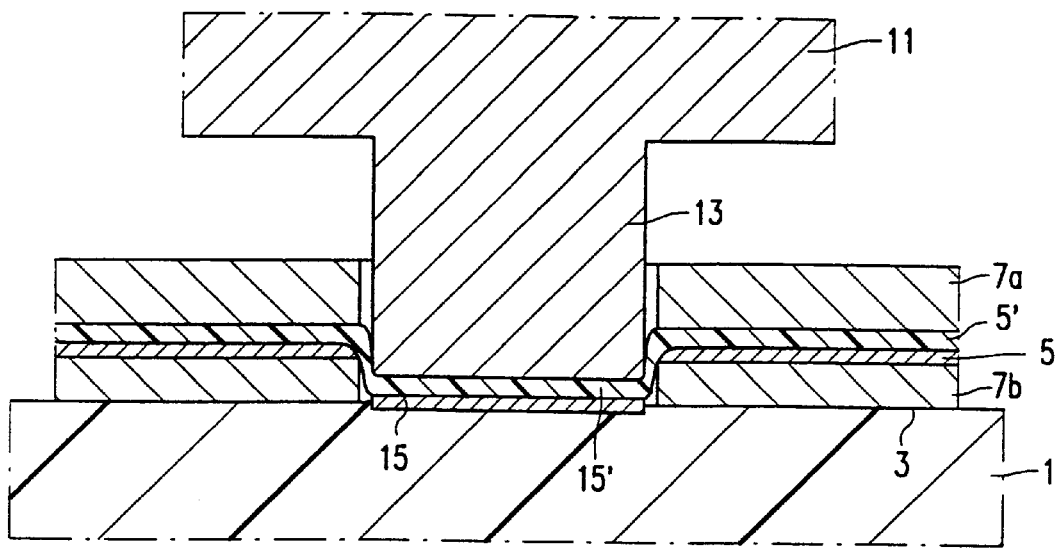
FIG. 8 depicts the subject of FIG. 7 during enaction of the inventive method.

An alternative to Embodiment 1 will now be elucidated with the aid of FIGS. 7 and 8.

FIG. 7 corresponds largely to FIG. 1, except that the metal foil 5 is attached to a non-metallic carrier foil 5' at the side of the metal foil 5 facing the snout 13. This carrier foil 5' may, for example, comprise a fifty μm-thick PTFE foil which is attached to the metal foil 5 using a layer of thermally softening adhesive (not depicted).

In FIG. 8, the snout 13 has been pushed through the aperture 9a and on into the aperture 9b. As a result of the consequent shear forces in the foil 5, the portion 15 of the foil 5 has severed from the surrounding foil 5. However, inter alia because of its greater shear modulus, the carrier foil 5' has remained intact, and the portion 15' attached to the portion 15 is not severed from the surrounding carrier foil 5'.

The composite 15,15' is pushed far enough downwards to allow the patterned metal layer 15 to make contact with the surface 3 of a thermoplastic substrate 1. Analogous to Embodiment 1, the elevated temperature of the snout 13 ($T_b \geq 100°$ C.) will cause the metal layer 15 to become embedded in the surface 3, whereas the gentle pressure applied by the snout 13 to the layer 15 ($p_b \leq 10$ N/mm²) will deter the occurrence of upset edges around the layer 15. The elevated temperature of the snout 13 also simultaneously allows separation of the layer 15 from the carrier foil portion 15', by thermally weakening their mutual adhesion.

Embodiment 3

Figure 9:
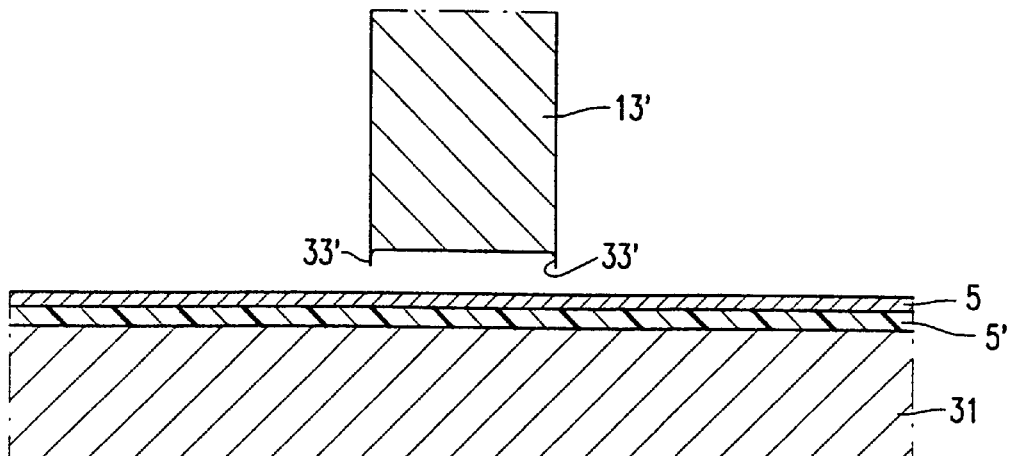
FIG. 9 cross-sectionally depicts yet another alternative set-up with which the method according to the invention can be enacted.
Figure 10:
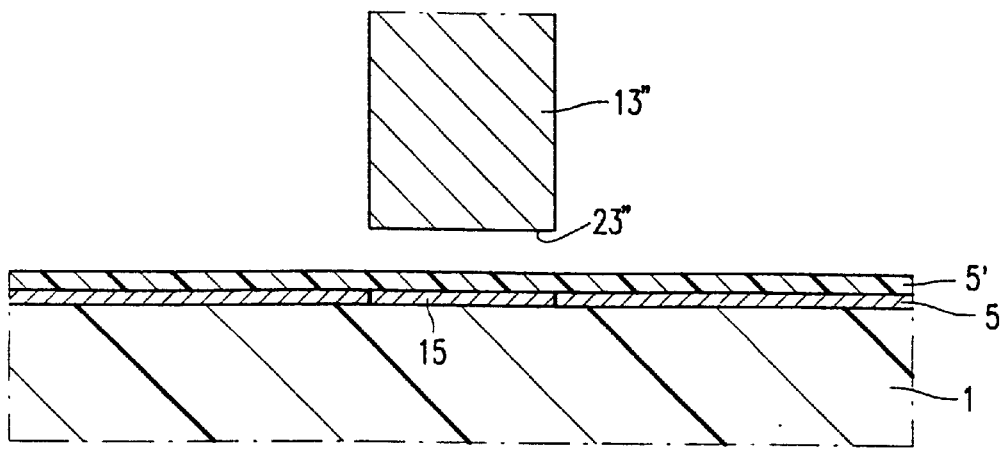
FIG. 10 shows the subject of FIG. 9 during enaction of part of the inventive method.

An alternative to Embodiment 2 will now be elucidated on the basis of FIGS. 9 and 10.

In FIG. 9, a metal foil 5 is attached to a non-metallic carrier foil 5' using a layer of thermally softening adhesive (as in Embodiment 2, e.g. paraffin wax). This foil composite 5,5' is placed on a smooth, hard plate 31 (comprised of metal or stone, for example), with the carrier foil 5' facing the plate 31. As in Embodiment 2, the surface of the metal foil 5 remote from the carrier foil 5' is coated with a thin layer of thermally activating adhesive (not depicted).

Also depicted is a punch-press 13'. In contrast to the punch-press 11,13 in Embodiment 2, the current punch-press 13':

has a knife edge 33' around the perimeter of its punching face;

does not comprise heating means, and is operated at room temperature.

In order to enact step (a) of the method according to the invention, the punch 13' is pushed into the composite 5,5' just so that the knife edge 33' reaches (but does not cut through) the carrier foil 5'. In so doing, the metal foil 5 is severed along a perimeter having the same shape as the perimetric knife edge 33'. A portion 15 of metal foil 5 thus severed remains adhered to the carrier foil 5' (see FIG. 10).

FIG. 10 depicts the subsequent enaction of step (b) of the inventive method. The foil composite 5,5' has now been placed on a thermoplastic substrate 1 so that the metal foil 5 faces the substrate 1. A press 13" is accurately positioned above the portion 15 severed during step (a). This press 13":

has a pressing surface 23" which has the same form and size as the area enclosed by the perimetric knife edge 33' in FIG. 9;

is provided with heating means (not depicted) so that it can be operated at an elevated temperature ($T_b \geq 100°$ C.).

When (in accordance with the invention) the press 13", at elevated temperature and at a pressure $p_b \leq 10$ N/mm², is pressed against the carrier foil above the portion 15, the portion 15 is:

pushed into the thermally softened substrate 1;

detached from the carrier foil 5'.

Embodiment 4

In the specific case of a SmartCard, the substrate 1 is a thermoplastic sheet having the dimensions of a standard Credit Card. Using the inventive method, one of the major faces of this substrate 1 is provided (near one of its short edges) with a cluster of metal lands 15. These lands 15 are disposed in rows so as make contact with the terminals of an IC to be located at the center of the cluster.

Each of the lands 15 has an area of the order of about 1–2 mm$^2$, whereas the cluster itself has an approximately rectangular form, with an area of the order of about 1 cm$^2$. The entire cluster ("patterned metal layer") can be punched from a metal foil in one go by using a punch-press whose punching surface has the same geometric form as the cluster.

We claim:

1. A method of selectively metallizing a thermoplastic substrate using a hot foil embossing technique, whereby a patterned metal layer is transferred to the substrate from a metal foil by a cutting and pressing procedure; said method comprising the steps of:

(a) cutting the patterned metal layer from the foil using a punch-press at a selected pressure $p_a$: and (b) attaching a surface of the cut patterned metal layer to the substrate using a press at a pressure $p_b$ which is $\leq 10$ N/mm$^2$ and also $<p_a$, and a temperature $T_b \geq 100°$ C.

2. A method according to claim 1, wherein steps (a) and (b) are performed at substantially the same temperature.

3. A method according to claim 1, wherein step (a) is performed at a lower temperature than $T_b$ used in step (b).

4. A method according to claim 1, wherein the metal foil is attached by an adhesive to a non-metallic carrier foil.

5. A method according to claim 1, wherein the surface of the metal layer to be attached to the substrate is provided with a film of thermally-activating adhesive.

* * * * *